United States Patent
Komai

(10) Patent No.: US 6,204,548 B1
(45) Date of Patent: *Mar. 20, 2001

(54) FUSE FOR SEMICONDUCTOR DEVICE AND SEMICONDUCTOR DEVICE

(75) Inventor: Yutaka Komai, Tsuchiura (JP)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,012

(22) Filed: Dec. 3, 1997

(30) Foreign Application Priority Data

Dec. 3, 1996 (JP) .................................................. 8-337582

(51) Int. Cl.$^7$ .................................................. H01L 29/00

(52) U.S. Cl. .......................... 257/529; 257/209; 257/211

(58) Field of Search .................................. 257/529, 209, 257/211; 337/159, 401, 416

(56) References Cited

U.S. PATENT DOCUMENTS

| | | | |
|---|---|---|---|
| 4,630,355 | * | 12/1986 | Johnson .................................. 29/574 |
| 5,025,300 | * | 6/1991 | Billig et al. ............................ 257/529 |
| 5,420,455 | * | 5/1995 | Gilmour et al. ....................... 257/529 |
| 5,608,257 | * | 3/1997 | Lee et al. ............................... 257/529 |
| 5,872,389 | * | 2/1999 | Nishimura et al. ................... 257/529 |
| 5,986,319 | * | 11/1999 | Huggins ................................. 257/529 |
| 5,986,321 | * | 11/1999 | Froehner ............................... 257/529 |

* cited by examiner

Primary Examiner—Mahshid Saadat
Assistant Examiner—George C. Eckert, II
(74) Attorney, Agent, or Firm—Bret J. Petersen; Frederick J. Telecky, Jr.

(57) ABSTRACT

To provide a semiconductor device fuse, which does not damage the lower layer when it is cut by irradiation with a laser beam. In forming a fuse 2 by forming an electroconductive thin film on the surface of a semiconductor substrate and patterning it, a cut part 4 is constituted by installing an expanding part 5 in a narrow-width part 3, and the cut part 4 is cut by irradiation with a laser beam. Even if scattering of the intensity of the laser beam and scattering of the irradiation position occur, no damage occurs in the lower layer, and an electrical element can be formed even at the position directly under the fuse 2. The cut part 4 preferably has a circular shape.

10 Claims, 9 Drawing Sheets

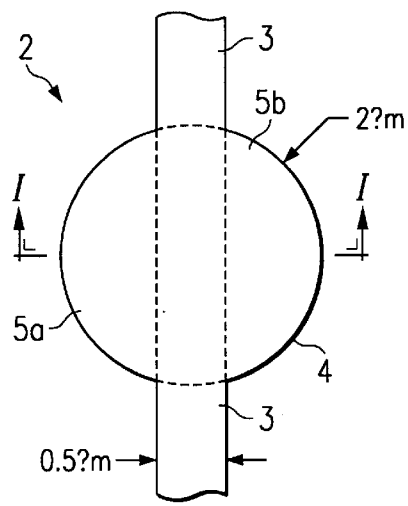
FIG. 1a
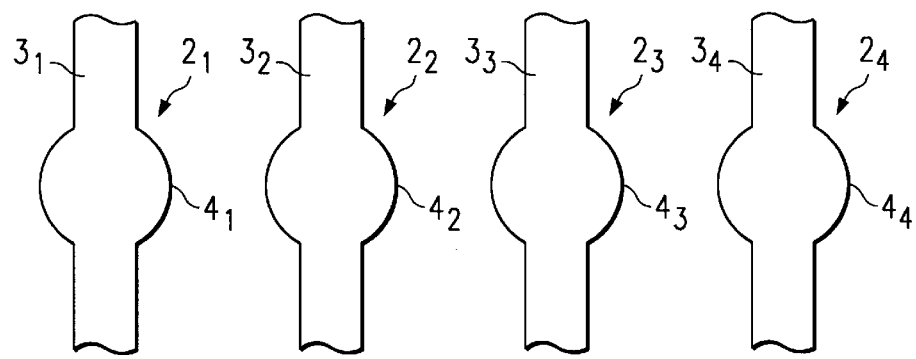
FIG. 1b
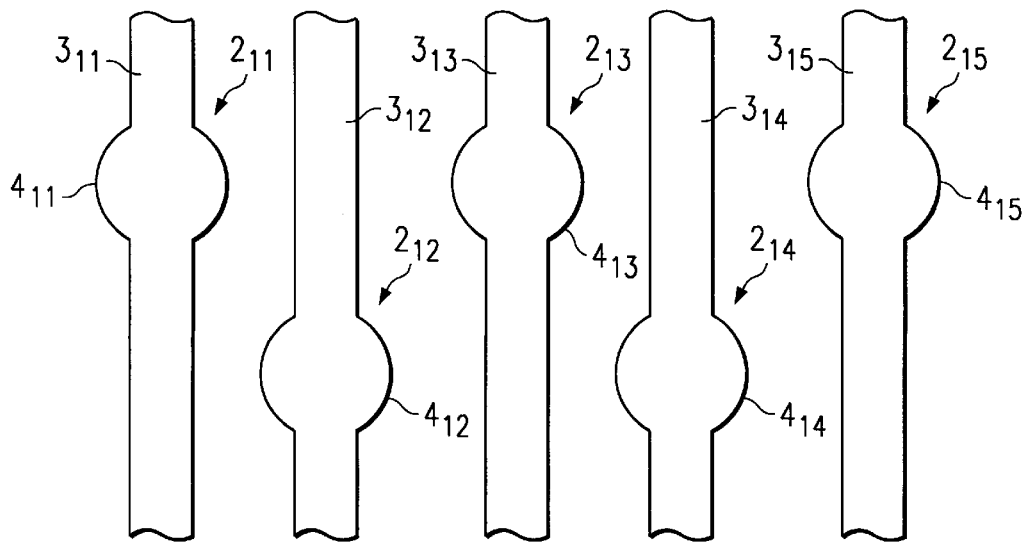
FIG. 2a
FIG. 2b

FUSE FOR SEMICONDUCTOR DEVICE AND SEMICONDUCTOR DEVICE

FIELD OF THE INVENTION

The present invention pertains to a fuse installed in a wiring pattern on a semiconductor substrate and in particular, pertains to a semiconductor device fuse used in circuit installation such as that cut by irradiation of an appropriate laser in accordance with the results of an operation check in a manufacturing process, cut-off of an inferior circuit, and operation of an auxiliary circuit.

BACKGROUND OF THE INVENTION

A semiconductor device fuse is installed in a wiring pattern to check the operation, etc., of a circuit at the wafer stage during the manufacture of a semiconductor device and to appropriately set and correct the circuit in accordance with the results, and operation of the circuit is prevented or a redundant circuit is operated by cutting part of the fuse.

Such a semiconductor device fuse is formed in a strip shape with a prescribed width, and in order to electrically cut the fuse, in general, it is partially thermally melted and evaporated by irradiating a laser beam at a prescribed position.

Such a laser beam irradiates the surface of the semiconductor substrate, however it is known that if a pulsed laser beam irradiates many fuses of a semiconductor device, the lower layer of the semiconductor device fuses is damaged at a prescribed rate. In such a case, if a semiconductor electric element is formed at the position directly under the semiconductor device fuses, the entire product is deteriorated.

According to the conventional technique, when many semiconductor device fuses installed in the semiconductor device, they are arranged together in one fuse region, and no semiconductor electric element is formed under each semiconductor device fuse, which is an ineffective region. Thus, even in case damage occurs, the generation of an inferior product is prevented, and the cutting workability of the semiconductor device fuses is improved.

However, recently, along with improvements in the degree of integration of semiconductor devices, the internal circuit has been made larger in scale and complicated, and the number of semiconductor device fuses required to set and correct the circuit has also increased. On the other hand, since the size of semiconductor device fuses is determined by the spot diameter of a laser beam and the precision of an irradiated position, the circuit cannot be reduced to smaller scale, and the ineffective region generated in the above-mentioned conventional technique increases to the degree that it cannot be ignored.

The present invention considers the above-mentioned problems, and its objective is to provide a semiconductor device fuse, which can form an electrical element and an interlayer wiring film without damaging its lower layer when it is cut by irradiation with a laser beam.

SUMMARY OF THE INVENTION

The inventor of the present invention researched the shape of fuses, and as a result, it was discovered that a semiconductor fuse could be reliably melted and evaporated by irradiation with a laser beam without damaging its lower layer.

The present invention is created based on the above-mentioned knowledge, and is characterized by the fact that a semiconductor fuse characterized by having a narrow-width part and a cut part formed by patterning an electron-conductive thin film installed on a semiconductor substrate and in which the above-mentioned cut part is connected via the above-mentioned narrow-width part to an electrical element formed on the semiconductor substrate, the above-mentioned cut part is formed in a shape wherein part of the laser beam, which cannot be blocked by the above-mentioned narrow-width part, can also be blocked, when the above-mentioned laser beam irradiates the above-mentioned narrow-width part; that when the above-mentioned laser beam irradiates, the electrical connection is opened.

With such a constitution, the part of the laser beam with a strong intensity, which damages the lower layer, reliably irradiates the semiconductor device fuse, so that it does not irradiate the thin film of its lower layer. As a result, damaging the semiconductor substrate and the thin layer of the lower layer is prevented.

In order for the laser beam not to be overshot, a detailed planar shape of the cut part of the semiconductor device fuse, as shown in the invention, may have an expanding part.

In the semiconductor device fuse described it is effective for the envelope shape of the above-mentioned expanding part to have a shape that fits the cross section shape of the above-mentioned laser beam.

In general, the cross section shape of the laser beam is circular. Therefore, in the semiconductor device fuse described, the envelope shape of the above-mentioned expanding part is preferably circular.

Since the invention described is equipped with the semiconductor device fuse described, a semiconductor electrical element can be installed at the position directly under it, and the ineffective region disappears, so that the size of the chips can be reduced.

Also, as for the semiconductor device equipped with several semiconductor device fuses, as in the invention described, when the above-mentioned cut parts of the mutually adjacent semiconductor device fuses are arranged, if they are controlled not to be arranged in one horizontal column, the cut parts do not cause problem when the semiconductor device fuses become closer to each other, which is favorable for the reduction of the size of chips.

BRIEF DESCRIPTION OF THE DRAWINGS

FIG. 1(*a*): A planar view showing an example of the fuse of the present invention.

(b): Its sectional constitutional diagram.

FIG. 2(*a*): A planar view showing an example of the semiconductor device of the present invention.

(b): A planar view showing another example of the semiconductor device of the present invention.

FIG. 3(*a*): A planar view showing the fuse of the present invention used in observing the surface.

(b): Its sectional constitutional diagram.

(c): A sectional structural diagram showing a wafer in which the fuse of the present invention and a fuse of a comparative example are formed.

Figure 4A:
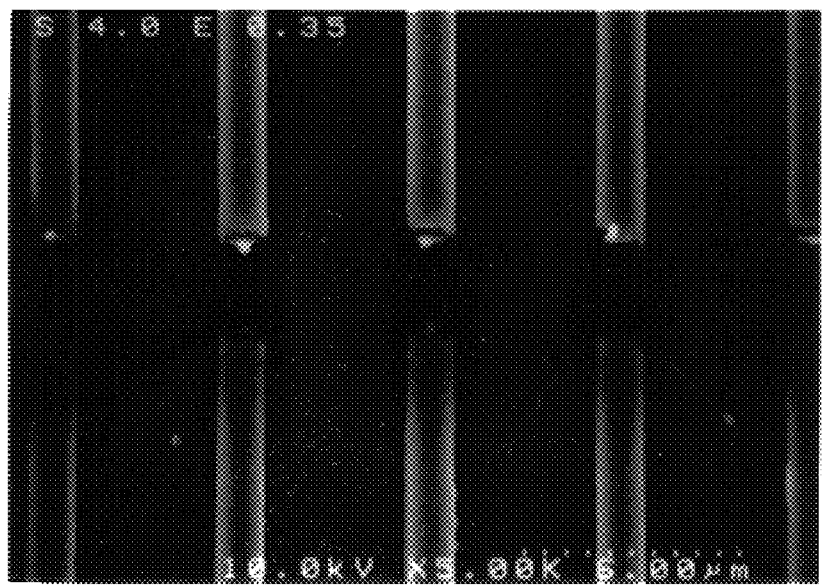
Figure 4B:
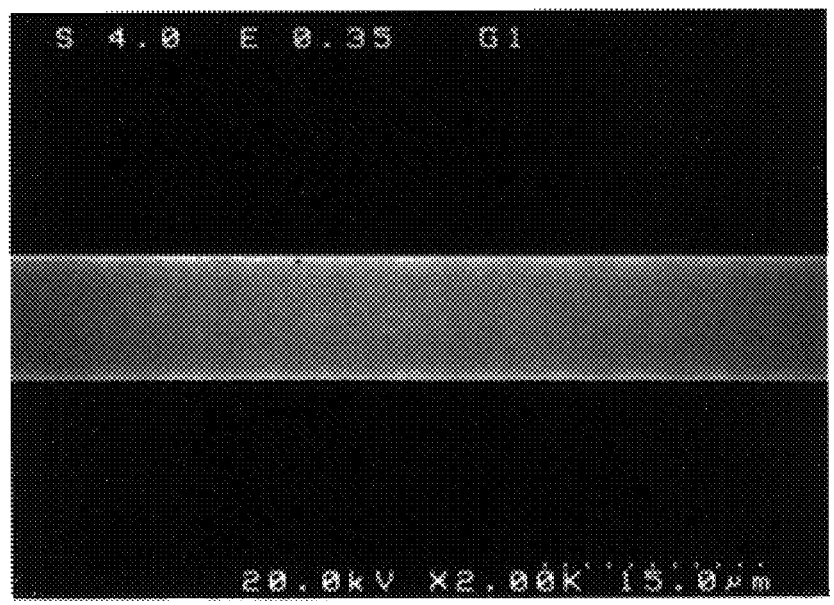

FIG. 4(*a*): A surface SEM photograph in the case of a fuse with a fine pattern as a comparative example formed on a substrate is cut at an output intensity of 0.35 µJ of a laser beam.

(b): A surface SEM photograph showing the surface of a thin metal film existing at its lower layer position.

Figure 5A:
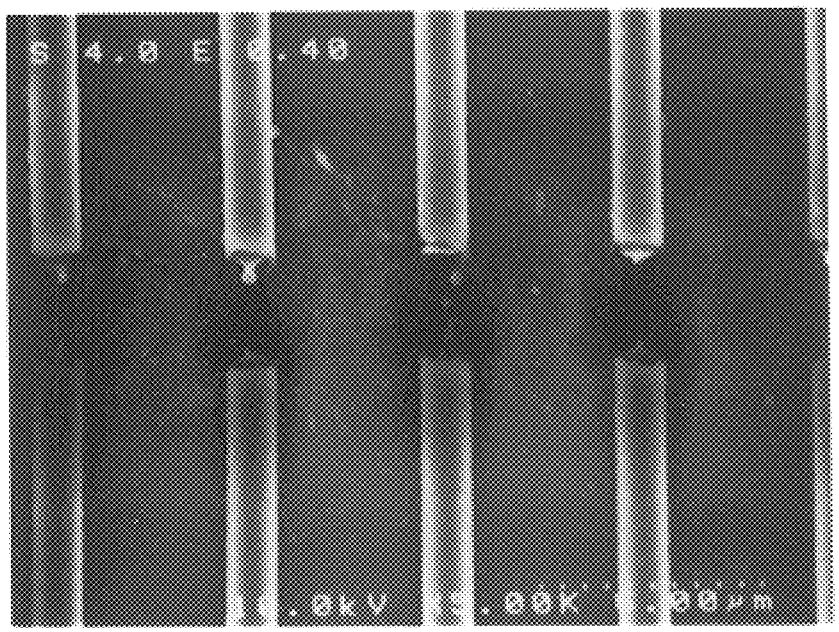
Figure 5B:
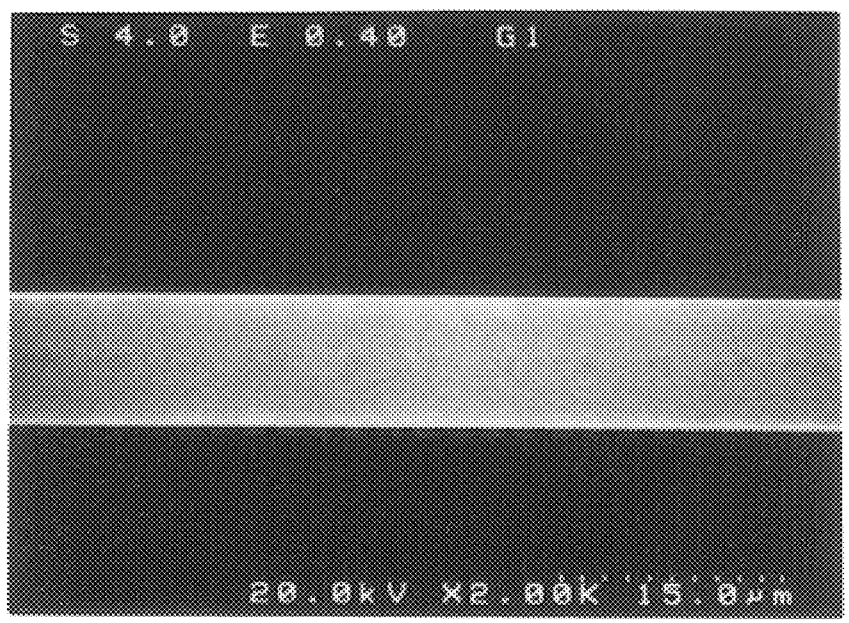

FIG. 5(*a*): A surface SEM photograph in the case of a fuse with a fine pattern as a comparative example formed on a substrate is cut at an output intensity of 0.4 µJ of a laser beam.

(b): A surface SEM photograph showing the surface of a thin metal film existing at its lower layer position.

Figure 6A:
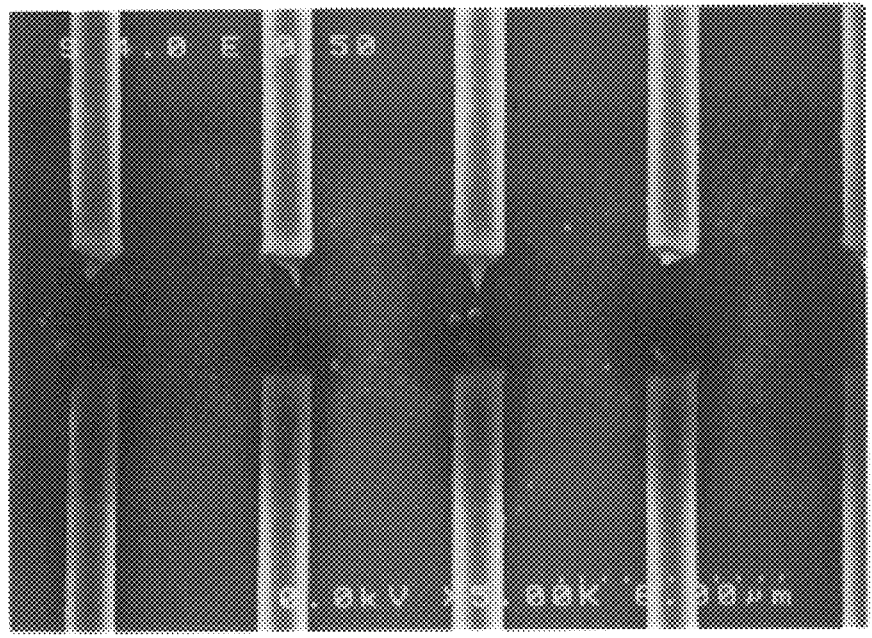

FIG. 6(a): A surface SEM photograph in the case of a fuse with a fine pattern as a comparative example formed on a substrate is cut at an output intensity of 0.5 μJ of a laser beam.

(b): A surface SEM photograph showing the surface of a thin metal film existing at its lower layer position.

Figure 7A:
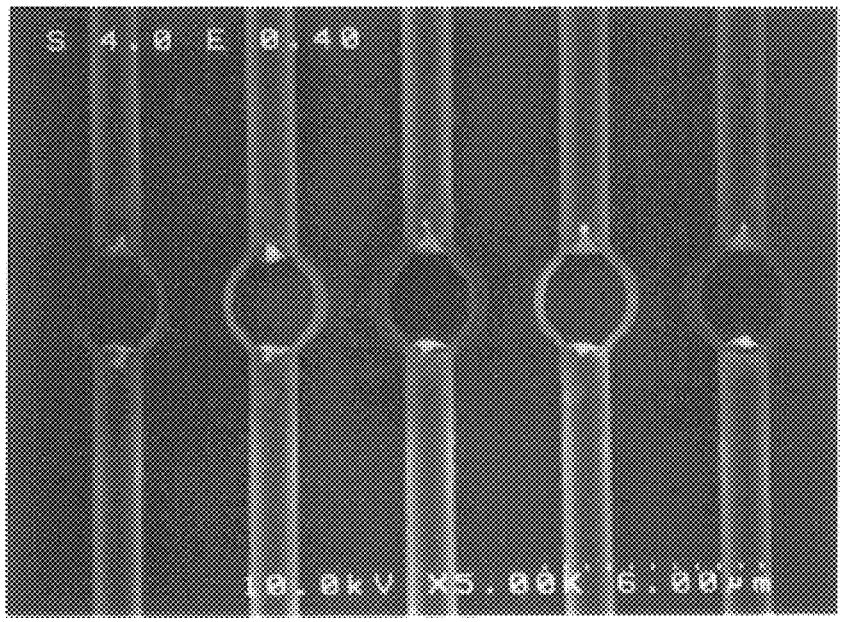

FIG. 7(a): A surface SEM photograph in the case of the fuse with a fine pattern as the application example of the present invention formed on a substrate is cut at an output intensity of 0.40 μJ of a laser beam.

(b): A surface SEM photograph showing the surface of a thin metal film existing at its lower layer position.

Figure 8A:
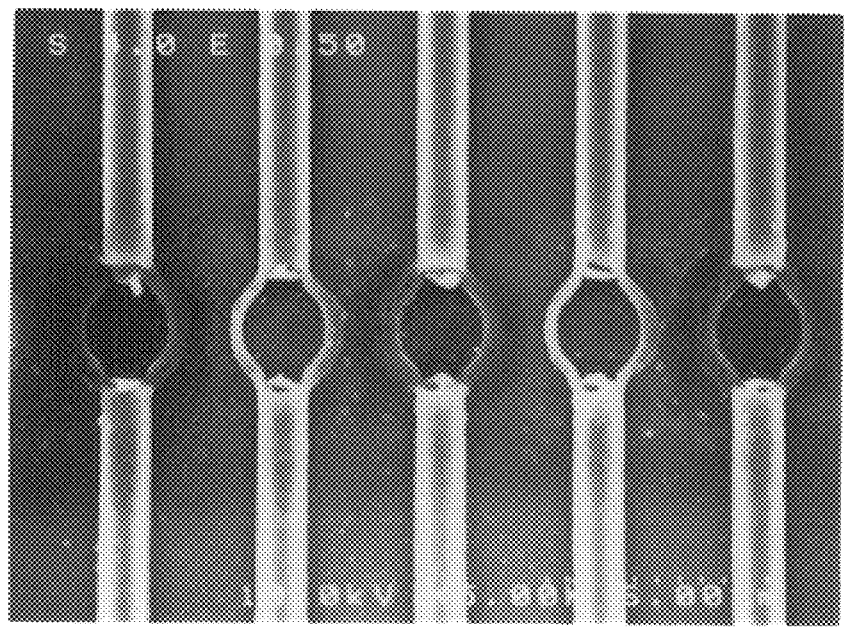

FIG. 8(a): A surface SEM photograph in the case of the fuse with a fine pattern as the application example of the present invention formed on a substrate is cut at an output intensity of 0.50 μJ of a laser beam.

(b): A surface SEM photograph showing the surface of a thin metal film existing at its lower layer position.

Figure 9A:
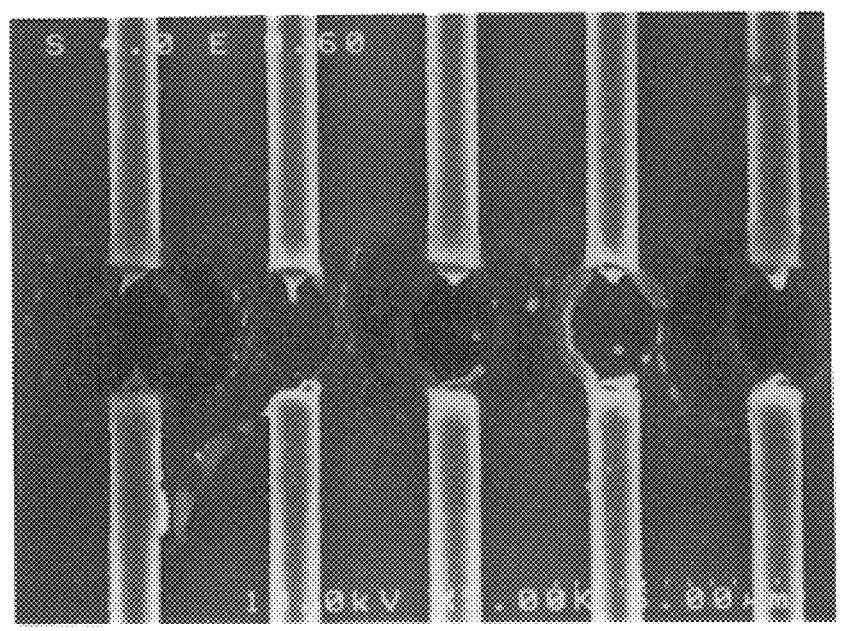

FIG. 9(a): A surface SEM photograph in the case of the fuse with a fine pattern as the application example of the present invention formed on a substrate is cut at an output intensity of 0.60 μJ of a laser beam.

(b): A surface SEM photograph showing the surface of a thin metal film existing at its lower layer position.

Figure 10A:
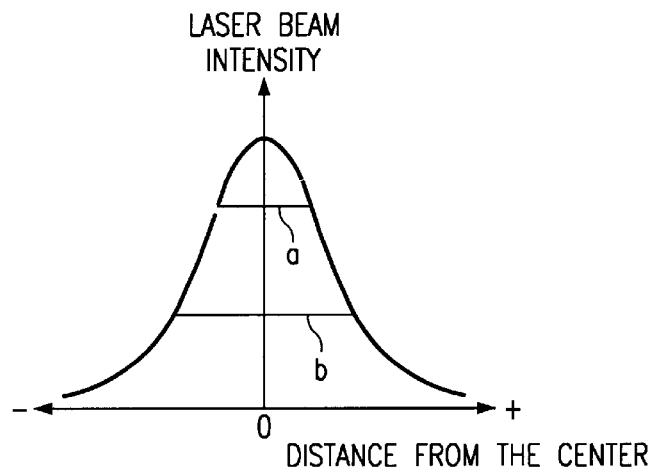
Figure 10B:
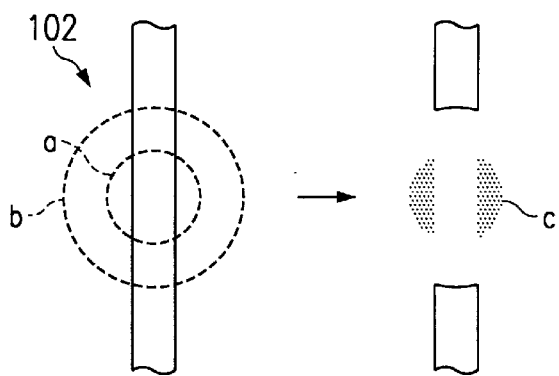
Figure 10C:
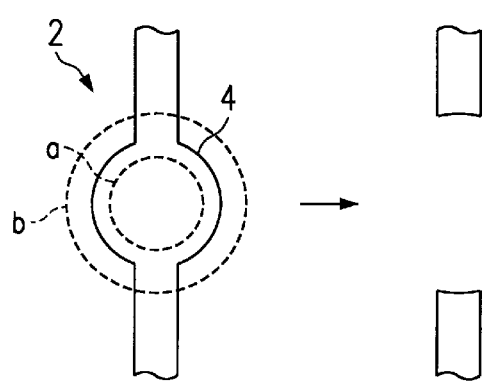

FIGS. 10(a)–(c): Diagrams for explaining the principle of the present invention.

DESCRIPTION OF THE EMBODIMENTS

Next, referring to the figures, the embodiments of the semiconductor device fuse of the present invention (hereinafter, simply abbreviated to as "fuse") are explained.

FIG. 1(a) shows a planar shape of the fuse 2 of one application pattern. An electroconductive thin film is formed on the entire surface of a semiconductor substrate by a sputtering process or vapor deposition process, and the electroconductive thin film is patterned by a photolithography process.

A narrow-width part 3 and a cut part 4 are installed in each fuse during patterning. The narrow-width parts 3 extending from both sides of the cut part 4 are respectively connected to prescribed circuit parts constituted by semiconductor elements, which are not shown in the figures.

The narrow-width part is formed in a strip shape 0.5-μm, and the cut part 4 is installed in a shape in which nearly semicircular expanding parts 5a and 5b are extended, at both sides of the narrow-width part 3. In terms of the shape of only cut part 4, the envelope shape is a nearly circular shape with a diameter of 2 μm. A laser beam irradiates the cut part 4.

A structure of the electroconductive thin film constituting the fuse 2 is shown in a cross section of FIG. 1(b). On an insulating film which is not shown in the figure, a thin tungsten film with a thickness of 500 Å formed by a sputtering process, a thin tungsten film with a thickness of 1000 Å formed on the surface by a CVD process, a thin Al—Si—Cu film with a thickness of 4000 Å formed on the surface by the sputtering process, and a thin TiN film with a thickness of 500 Å formed on the surface are constituted in the order of the lower layer, and a protective film, which is not shown in the figures, is formed on the surface.

Also, in a photomask used in the above-mentioned photolithography process, the shape of the cut part 4 with a pattern formed on the photomask is not necessarily circular, and for example, it may also be an octagonal shape or hexagonal shape. The reason for this is that in the patterning of the resist in the photolithography process, the part with an angle in the pattern drags and exhibits roundness. In general, in case the resist is patterned in a circular pattern, the photomask, in which a pattern with an octagonal shape or hexagonal shape is formed, is used, and even in case the cut part of the fuse of this application pattern is patterned, the photomask pattern with such an octagonal shape, or hexagonal shape, or other polygonal shapes, can be used.

FIG. 2(a) shows a state in which narrow-width parts $3_1$–$3_4$ are mutually arranged in parallel at a pitch of 4.0 μm and each cut part $4_1$–$4_4$ is positioned on the same line and arranged on one semiconductor device in fuses $2_1$–$2_4$ of this application pattern. At that time, the interval between the nearest parts of the mutually adjacent cut parts $4_1$–$4_4$ is 2.0 μm.

On the other hand, FIG. 2(b) shows a case in which narrow-width parts $3_{11}$–$3_{15}$ are arranged and each cut part $4_{11}$–$4_{15}$ is positioned in a zigzag shape in the fuses $2_{11}$–$2_{15}$ of this application pattern. In the cut parts $4_{11}$–$4_{15}$, the mutually adjacent cut parts are not arranged in one horizontal column, and similarly to the case of the fuses 21–24 of FIG. 2(a), when the interval between the ends of the adjacent cut parts $4_{11}$–$4_{15}$ and the nearest parts of the narrow-width parts $3_{11}$–$3_{15}$ is 2.0 μm, the pitch of the narrow-width parts $3_{11}$–$3_{15}$ is 3.75 μm.

In case the minimum interval of the fuses is set, the narrow-width parts $3_{11}$–$3_{15}$ of the fuses $2_{11}$–$2_{15}$ of FIG. 2(b) can be made closer to each other, compared with the narrow-width parts $3_1$–$3_4$ of the fuses $2_1$–$2_4$ of FIG. 2(a), and the fuses can be arranged densely. Therefore, if the cut parts are arranged so that the mutually adjacent cut parts are not positioned in one horizontal column, the area of the fuse region can be reduced.

Also, like the above-mentioned fuses $2_1$–$2_4$ and $2_{11}$–$2_{15}$, if several fuses are arranged together in one fuse region, the efficiency of the cutting work by the laser beam can be raised. However, in the fuses of the present invention, unlike the conventional technique, since no damage occurs on the interlayer wiring thin film and the silicon substrate, which exist at the lower layer of the fuses, it is not necessary to arrange the fuses together. Also, the fuses can be arranged in an optional position by mixing with other circuit elements without installing a special fuse region. Thus, according to the fuse of the present invention, since the semiconductor element can be formed at the lower layer of the fuse, the degree of freedom of the circuit design is increased.

Using electroconductive thin films with the same constitution, the fuse of the present invention and a conventional fuse were prepared under the same conditions, irradiated with a laser beam, and cut. The state was then observed by SEM.

Figure 3A:
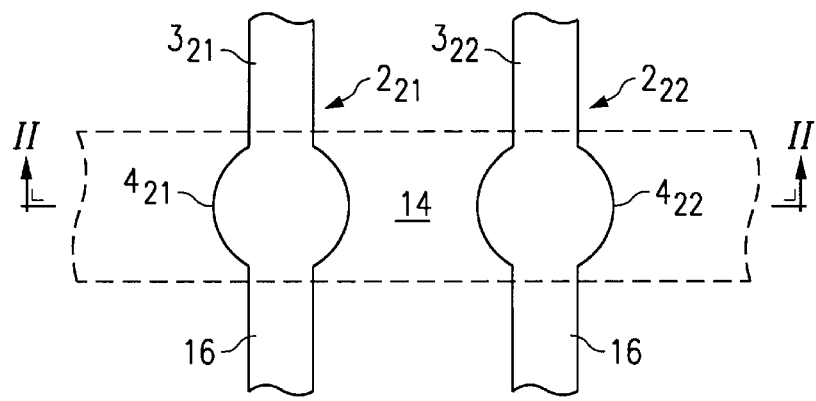
Figure 3B:
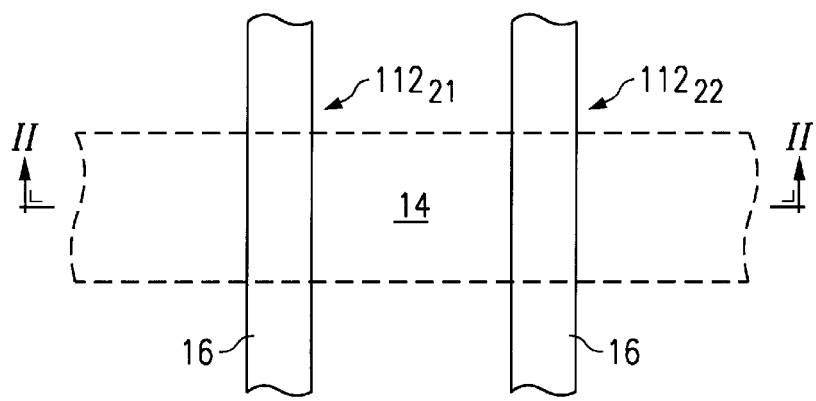

FIGS. 3(a) and (b) show fuses used when cutting. FIG. 3(a) shows fuses $2_{21}$ and $2_{22}$ of the present invention, and FIG. 3(b) shows fuses $112_{21}$ and $112_{22}$ of the conventional technique as a comparative example.

The fuses $112_{21}$ and $112_{22}$ of the comparative example do not have cut parts $4_{21}$ and $4_{22}$ like the fuses $2_{21}$ and $2_{22}$ of the present invention and are molded in a strip shape with the same width as that of the narrow-width parts $3_{21}$ and $3_{22}$.

Figure 3C:
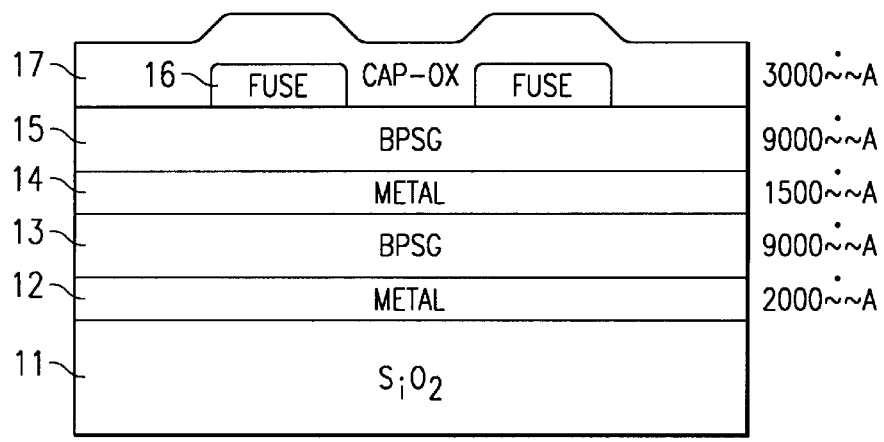

FIG. 3(c) is a cross structural diagram in which the fuses $2_{21}$ and $2_{22}$ of the present invention and the fuses $112_{21}$ and $112_{22}$ of the comparative example are formed.

In this wafer, on an insulating film 11 composed of silicon oxide formed on a silicon substrate surface, which is not shown in the figure, first metal layer 12 (a thickness of 2000 Å), first interlayer insulating film layer 13 (a thickness of 9000 Å), second metal layer 14 (a thickness of 1500 Å), second interlayer insulating film layer 15 (a thickness of 9000 Å), and fuse layer 16 (a thickness of 4000 Å) are formed in the order of the lower layer. The fuses $2_{21}$ and $2_{22}$ are formed by patterning the fuse layer 16, and a protective film layer 17 (a thickness of 3000 Å) is then formed on the surface.

Also, the first and second metal layers 12 and 14 are composed of a thin tungsten film, and the first and second interlayer insulating film layers 13 and 15 are composed of a BPSG film. The fuse layer 16 is composed of the same laminated film as that of the above-mentioned fuse 2, and the protective film layer 17 (CAP-OX) is composed of a silicon oxide film.

In the fuses $2_{21}$ and $2_{22}$ of the present invention, the laser beam irradiates the cut parts $4_{21}$ and $4_{22}$, and the energy is absorbed by the fuse layer 16 constituting the cut parts $4_{21}$ and $4_{22}$. These fuses are cut by melting and evaporating the parts. On the other hand, the fuses $112_{21}$ and $112_{22}$ of the comparative example are cut by irradiation with the laser beam to the part with a strip shape. At that time, in any of the fuses, the part positioning the fuse 16 of the protective film layer 17 is broken and removed along with the fuse layer 16.

In this experiment, cutting was carried out by irradiation with the laser beam while variously changing the power of the laser beam, and the state of the cut trace was observed from the top of the wafer. Then, the protective film layer 17, fuse layer 16, and protective film layer 15 were removed, and a photograph was taken of the second metal layer 14, the surface state of the part positioned directly under the fuses $2_{21}$ and $2_{22}$ and the fuses $112_{21}$ and $112_{22}$.

Any of the fuses of the present invention and the comparative example could be cut when a laser beam with an intensity of about 0.3–1.0 µJ was used for irradiation, however no fuses could be broken at 0.2 µJ.

Figure 6B:
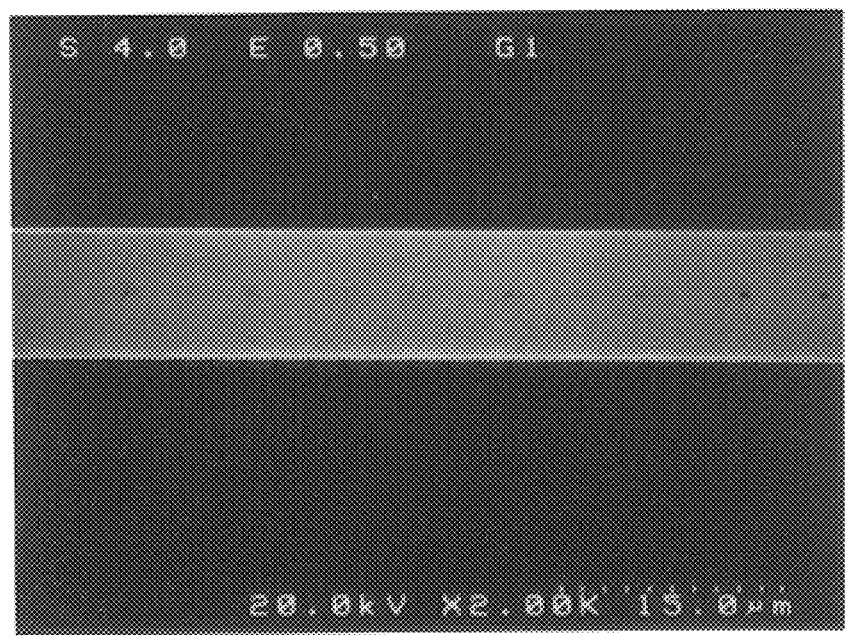
Figure 7B:
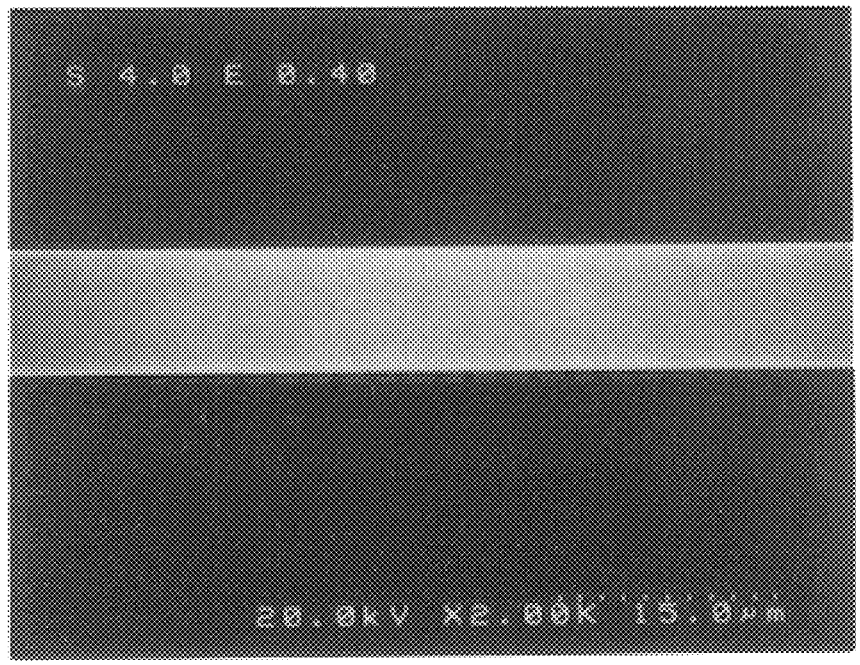
Figure 8B:
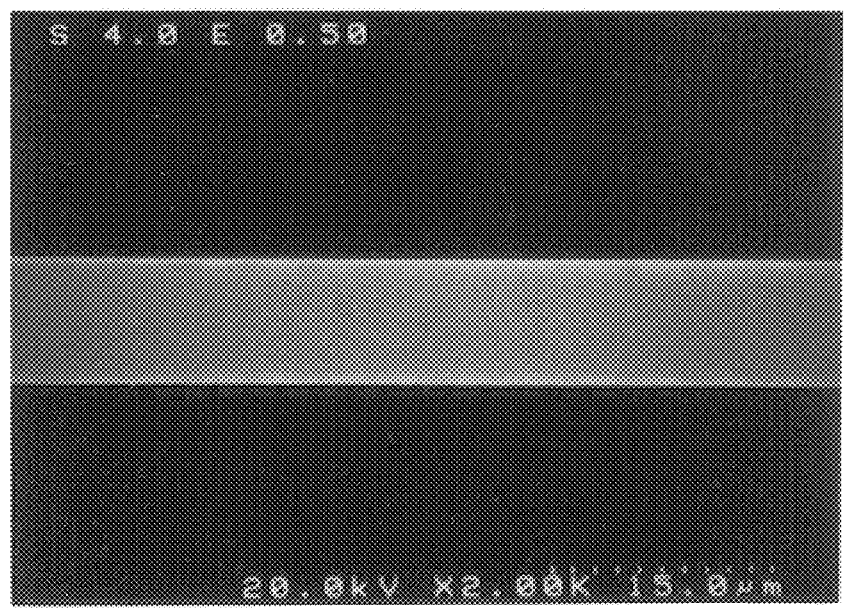
Figure 9B:
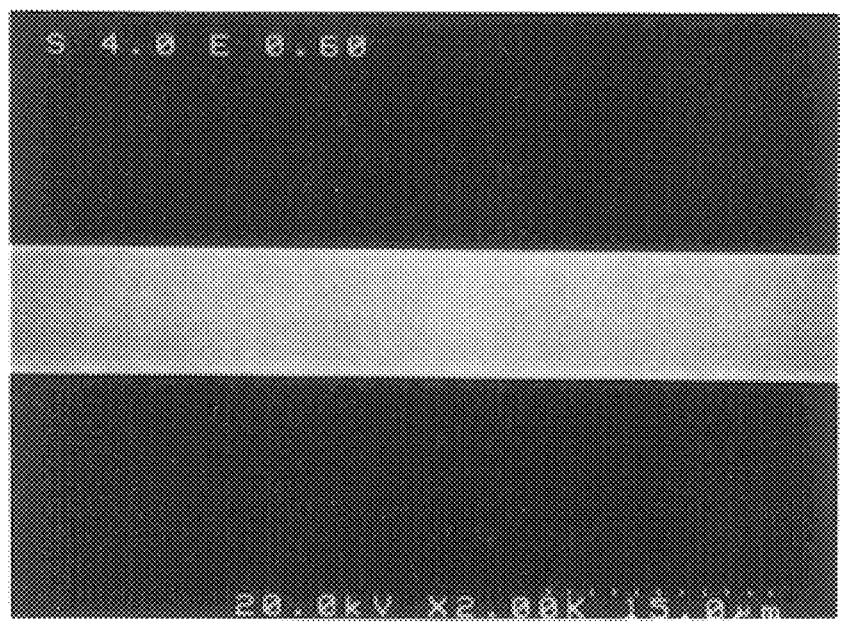

FIGS. 4–6 are SEM photographs of the fuses $112_{21}$ and $112_{22}$ of the comparative example being cut by irradiation with the laser beam. FIGS. 7–9 are SEM photographs of the fuses $2_{21}$ and $2_{22}$ of the present invention being cut by irradiation with the laser beam.

The output intensity of the laser beam in the comparative example is 0.35 µJ in FIG. 4, 0.40 µJ in FIG. 5, and 0.50 µJ in FIG. 6, and in the present invention, the output intensity is 0.40 µJ in FIG. 7, 0.50 µJ in FIG. 8, and 0.60 µJ in FIG. 9.

Each photograph shown in FIGS. 4–9(a) is a planar view of the photographs of the shape of the cut trace. The photograph shown in FIG. 4–9(b) is obtained by removing the protective film layer 17, fuse layer 16, and protective film layer 15 and then photographing the surface of the second metal layer 14 existing at the lower layer position of the fuses.

As seen from these photographs, in case the fuses $112_{21}$ and $112_{22}$ of the comparative example are cut, no damage is observed at an output intensity of 0.35 µJ of the laser beam in the second metal layer 14, however damage is generated when the output intensity of the laser beam is 0.40 µJ and 0.50 µJ.

From these results, an output intensity of the laser beam to the fuses of the comparative example of 0.35 or more and less than 0.4 µJ is a usable range, and the intensity range is very narrow.

On the other hand, in the fuses $2_{21}$ and $2_{22}$ of the present invention, at an output intensity of the laser beam of any of FIGS. 7–9, no damage is observed in the second metal layer 14. If the output intensity of the laser beam is increased beyond 0.60 µJ, though it is not shown in the figure, the generation of damage is recognized at 0.65 µJ.

Therefore, an output intensity of the laser beam to the fuses of the present invention of 0.40 or more and less than 0.65 µJ is a usable range, and compared with the comparative example, the intensity range of the laser beam in the present invention is wide.

On the other hand, in a commonly used laser beam generator, it is known that if the output intensity of the laser beam is narrowed, scattering of the output intensity is increased, and it is difficult to control the output intensity to a narrow intensity range suitable for the comparative example. For this reason, when a pulsed laser beam continuously irradiates many fuses, if such a laser beam irradiates the fuses, damage can sometimes occur on the lower layer. Therefore, in case the fuses of the comparative example are cut without damaging the lower layer, a device which can very precisely control the output intensity of the laser beam is required.

On the other hand, in the fuses $2_{21}$ and $2_{22}$ of the present invention, since the output intensity of the laser beam can be set high, scattering of the output intensity is also decreased, and even for pulsed irradiation, it is easy to control to an allowable intensity of less than 0.65 µJ.

Therefore, it can be said that a possibility of damaging the lower layer is not substantial in the fuses $2_{21}$ and $2_{22}$ of the present invention.

As explained above, in the present invention, the cut part, which is irradiated by a laser beam, expands out in the same circular shape as the shape of the laser beam, so that the lower layer is not damaged.

Also, the reason why the damage to the lower layer can be reduced by the fuses of the present invention can be considered as follows.

The diameter of the laser beam used in cutting this kind of fuse is generally about 2.7 µm at minimum and usually 4–5 µm, however the intensity in the beam cross section is not uniform. The intensity distribution in the beam diameter, as is well known, exhibits a Gaussian curve shape as shown in FIG. 10(a), is strong at the center position of the laser beam, and is weakened toward the outer periphery in the diameter direction.

For example, when such a laser beam irradiates the position where fuses are arranged, at the strong center part as shown by a, it penetrates into the protective film 17 and the second interlayer insulating film layer 15, so that damage sometimes occurs in the thin film of the lower layer (in FIG. 3(b), second metal layer 14, first metal layer 12 at the position where the second metal layer 14 is not present, and silicon substrate 11 at the position where the first metal layer 12 is not present). At the peripheral part with a weak intensity, even if no fuse is arranged, damage does not occur in the lower layer.

The energy required for melting and evaporating the fuses depends on the material and the thickness of the fuses, however when the laser beam of such an intensity distribution irradiates the fuses, it is always blocked at the central part with a strong intensity, shown by FIG. 10a, by the fuses and is seldom absorbed. The laser beam, which is not completely absorbed and arrives at the lower layer, has a weak intensity to a degree shown by b.

On the other hand, it is considered that the laser beam, which overshoots the fuses and arrives at the lower block without being blocked by the fuses, is the peripheral part of the laser beam and originally has a weak intensity to a degree shown by b.

When the laser beam irradiates the fuses $112_{21}$ and $112_{22}$ of the conventional technique as the above-mentioned comparative example, the peripheral part with a strong intensity shown by a directly irradiates the substrate at both sides of the fuses. For this reason, in the lower layer, the region c is a range where the laser beam with a relatively strong intensity irradiates.

However, even in the region c, it is considered that if the output intensity of the laser beam and the irradiation position are precisely controlled, no damage occurs in the lower layer, even by being directly irradiated.

However, it is considered that if the irradiation position of the beam is shifted unexpectedly, the part near the center position of the laser beam is not blocked by the fuses and directly irradiates the lower layer. In particular, in case the irradiation position is shifted to the left and right direction of the figure, the part relatively close to the center position of the laser beam is blocked by the fuses, and the laser beam with a considerable strong intensity arrives at the lower layer. Also, if the output intensity of the laser beam is scattered, the laser beam intensity directly irradiating the area c is also reinforced as much. It is considered that when such a scattering of the position control and the intensity control is overlapped in a negative direction, damage occurs in the undercoat.

On the contrary, in the present invention, as shown in FIG. 10(c), the shape of the fuses was researched, and the fuses could block the entire strong part a of the laser beam intensity. Furthermore, it is considered that since the planar shape of the fuses is a circular shape which is a cross section shape of the laser beam, although the irradiation position is shifted in any direction, the part near the center position of the laser beam does not arrive directly at the lower layer, and no damage occurs.

However, if the output intensity of the laser beam is increased, the intensity of the peripheral area as well as the center position of the laser beam is also increased, and since the part with the intensity b also arrives at the intensity a, if the laser beam intensity is increased, damage occurs in the lower layer.

Also, the actual diameter of the expanding part of the fuses can be attained by experiments and calculations in accordance with the output of the laser and the diameter of the beam. Also, in case the cross section shape of the laser beam is not circular, a shape similar to the same shape as the cross section shape may be adopted. Also, it has been explained that the above-mentioned narrow-width part is molded in a linear strip, however the narrow-width part of the fuse of the present invention is not limited to it.

The semiconductor device fuse of the present invention is constituted in such a manner that the energy of a laser beam is consumed by melting and evaporating the fuse itself and attenuated down to the amount of energy which does not damage the lower layer. Thus, damage does not occur to an interlayer wiring film of the lower layer and a silicon substrate, so that the reliability of the semiconductor device can be raised.

Also, since no damage occurs in the lower layer of the fuse, a semiconductor element can also be formed at the position directly under the fuse, so that not only the ineffective region appears, but the degree of freedom of the circuit design is increased.

Furthermore, not only the intensity range of the laser beam is increased, but the cut part is made large, so that the laser beam irradiation area is extended, thereby increasing the alignment range. Also, since the blocking area of the laser beam is extended and a range is also formed in the irradiation position precision, the productivity is improved, and the generation of products with inferior quality is also reduced.

What is claimed is:

1. A semiconductor device comprising an integrated electronic circuit formed on a semiconductor substrate;
    a fuse coupled to said electronic circuit and formed on said substrate, said fuse having a narrow width portion and a laser beam severable portion, said severable portion having a substantially circular shape, said fuse being located directly over at least one active electrical element of said integrated electronic circuit.

2. The semiconductor device of claim 1 wherein said severable portion of said fuse is larger than said narrow width portion.

3. The semiconductor device of claim 1 further comprising a plurality of fuses as described by said fuse, wherein said plurality of fuses are placed side by side, said severable portions of said fuses being staggered so that said fuses can be located closer together.

4. In a semiconductor device comprising an integrated electronic circuit, a fuse comprising:
    a first portion;
    a second portion wider than said first portion for being severed by a laser beam, said second portion having a shape corresponding to a shape of said laser beam, said fuse being placed over an active area of said integrated electronic circuit.

5. The semiconductor device of claim 4 wherein said shape of said severable portion of said fuse is circular.

6. The semiconductor device of claim 4 wherein a plurality of fuses are placed side by side, said severable portions of said fuses being staggered so that fuses can be located closer together.

7. The semiconductor device of claim 4 wherein said shape of said severable portion of said fuse is hexagonal.

8. The semiconductor device of claim 4 wherein said shape of said severable portion of said fuse is octagonal.

9. The semiconductor device of claim 4 wherein said shape of said severable portion of said fuse is circular.

10. A semiconductor device comprising an integrated electronic circuit formed on a semiconductor substrate;
    a fuse coupled to said electronic circuit and formed on said substrate, said fuse having a narrow width portion and a laser beam severable portion, said fuse being located directly over at least one active electrical element of said integrated electronic circuit, and said severable portion having a shape chosen from one of the following: hexagon, octagon, other circular shaped polygon having at least 6 sides.

* * * * *